US012647075B2

(12) United States Patent
Kim et al.

(10) Patent No.: US 12,647,075 B2
(45) Date of Patent: Jun. 2, 2026

(54) DIFFERENTIAL SIGNALING CIRCUIT FOR CORRECTING FOR DUTY CHANGE DUE TO NBTI DEGRADATION, OPERATING METHOD THEREOF, AND SEMICONDUCTOR DEVICE INCLUDING THE SAME

(71) Applicant: SAMSUNG ELECTRONICS CO., LTD., Suwon-si (KR)

(72) Inventors: Jehoon Kim, Suwon-si (KR); Dongho Shin, Suwon-si (KR); Jung-June Park, Suwon-si (KR); Hyunsuk Kang, Suwon-si (KR); Chiweon Yoon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 518 days.

(21) Appl. No.: 18/221,128

(22) Filed: Jul. 12, 2023

(65) Prior Publication Data

US 2024/0128935 A1 Apr. 18, 2024

(30) Foreign Application Priority Data

Oct. 13, 2022 (KR) ......................... 10-2022-0131594

(51) Int. Cl.
*H03F 3/45* (2006.01)
*H03F 1/30* (2006.01)

(52) U.S. Cl.
CPC ........... *H03F 1/30* (2013.01); *H03F 3/45076* (2013.01); *H03F 2203/45664* (2013.01)

(58) Field of Classification Search
CPC ........................................................ H03F 3/45
USPC .................................................. 330/252, 69
See application file for complete search history.

(56) References Cited

U.S. PATENT DOCUMENTS

| | | | |
|---|---|---|---|
| 7,176,720 B1 | 2/2007 | Prather et al. | |
| 7,633,329 B2 | 12/2009 | Park | |
| 8,384,438 B1 | 2/2013 | Du et al. | |
| 8,401,098 B2 | 3/2013 | Bae et al. | |
| 9,524,761 B2 | 12/2016 | Lee et al. | |
| 9,966,126 B2 | 5/2018 | Ahn et al. | |
| 2017/0372764 A1 | 12/2017 | Ahn et al. | |

FOREIGN PATENT DOCUMENTS

| | | |
|---|---|---|
| CN | 107527647 A | 12/2017 |
| KR | 10-2012-0033885 A | 4/2012 |

*Primary Examiner* — Henry Choe
(74) *Attorney, Agent, or Firm* — Sughrue Mion, PLLC

(57) ABSTRACT

A differential signaling circuit is provided. The differential signaling circuit includes: a differential amplifier configured to generate differential signals; a first signal path circuit; a second signal path circuit; a phase control circuit configured to receive the differential signals having a common phase, output DC signals having a common level in a first operating period, and transmit the differential signals to the first signal path circuit and the second signal path circuit, respectively, in a second operating period; and a duty ratio correction circuit connected between the first signal path circuit and the second signal path circuit, and configured to control duty ratios of the differential signals to be equal to each other in the second operating period.

20 Claims, 12 Drawing Sheets

FIG. 1

DIFFERENTIAL SIGNALING CIRCUIT FOR CORRECTING FOR DUTY CHANGE DUE TO NBTI DEGRADATION, OPERATING METHOD THEREOF, AND SEMICONDUCTOR DEVICE INCLUDING THE SAME

CROSS-REFERENCE TO RELATED APPLICATION

This application claims priority under 35 U.S.C. § 119 to Korean Patent Application No. 10-2022-0131594, filed on Oct. 13, 2022, in the Korean Intellectual Property Office, the disclosure of which is incorporated by reference herein in its entirety.

BACKGROUND

The present disclosure relates to a differential signaling circuit, and more particularly, to a differential signaling circuit capable of correcting a duty ratio change due to negative bias temperature instability (NBTI) degradation, an operating method thereof, and a semiconductor device including the differential signaling circuit.

The duty ratio 'D' (or duty rate) is defined as the ratio between a pulse duration (or pulse width) PW and a period T of a rectangular waveform, and may be expressed in Equation 1 below.

$$D = \frac{PW}{T} \times 100 \qquad \text{[Equation 1]}$$

The duty ratio, also called a duty cycle or a power cycle, is the fraction of one period during which a signal or a system is active. Duty ratios are usually expressed as percentages or ratios.

Synchronous semiconductor memory devices operate in synchronization with a clock signal supplied from the outside. In particular, a double data rate (DDR) synchronous memory device continuously processes two bits of data during one period of a clock signal in synchronization with rising and falling edges of the clock signal.

In synchronous semiconductor memory devices, it is very important to accurately control a duty ratio of a clock signal.

However, the duty ratio of the clock signal may be distorted due to process variations, voltage variations, and temperature variations (PVT variations). When the duty ratio of the clock signal is not precisely controlled to 50%, because a margin of data synchronized with the clock signal is not secured, data may be distorted.

SUMMARY

One or more example embodiments provide a differential signaling circuit that recovers a change in duty ratio due to negative bias temperature instability (NBTI) deterioration by inducing a duty ratio distortion due to the NBTI deterioration caused by differential signals in the same direction, and then interpolating the differential signals, an operating method thereof, and a semiconductor device including the differential signaling circuit.

According to an aspect of an example embodiment, a differential signaling circuit includes: a differential amplifier configured to generate differential signals; a first signal path circuit; a second signal path circuit; a phase control circuit configured to receive the differential signals having a common phase, output DC signals having a common level in a first operating period, and transmit the differential signals to the first signal path circuit and the second signal path circuit, respectively, in a second operating period; and a duty ratio correction circuit connected between the first signal path circuit and the second signal path circuit, and configured to control duty ratios of the differential signals to be equal to each other in the second operating period.

According to an aspect of an example embodiment, a semiconductor system includes: a first semiconductor device; and a second semiconductor device including a differential signaling circuit. The differential signaling circuit includes: a differential amplifier configured to generate differential signals; a first signal path circuit; a second signal path circuit; a phase control circuit configured to receive the differential signals having a common phase, output DC signals having a common level in a first operating period, and to transmit the differential signals to the first signal path circuit and the second signal path circuit, respectively, in a second operating period; and a duty ratio correction circuit connected between the first signal path circuit and the second signal path circuit, and configured to control duty ratios of the differential signals to be equal to each other in the second operating period.

According to an aspect of an example embodiment, a differential signaling method includes: receiving differential signals having a common phase; generating DC signals, each having a common level in a first operating period; transmitting the DC signals to a first signal path circuit and a second signal path circuit, respectively; transmitting the differential signals to the first signal path circuit and the second signal path circuit, respectively, in a second operating period; and controlling duty ratios of the differential signals to be equal to each other in the second operating period.

BRIEF DESCRIPTION OF DRAWINGS

The above and other aspects and features will be more apparent from the following description of example embodiments taken in conjunction with the accompanying drawings, in which:

FIG. 1 is a circuit diagram of a differential signaling circuit, according to an example embodiment.

DETAILED DESCRIPTION

Figure 2:
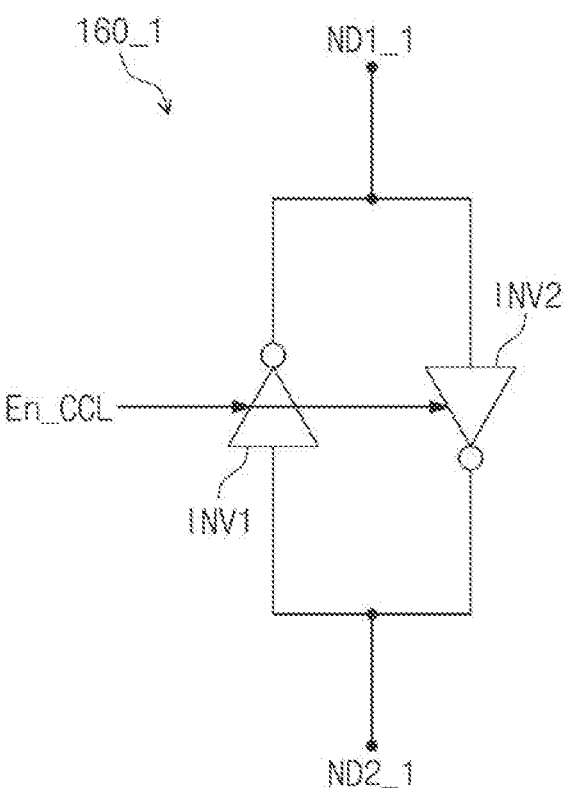
FIG. 2 is a circuit diagram of a cross-coupled inverter latch illustrated in FIG. 1, according to an example embodiment.

Example embodiments will be described with reference to the accompanying drawings. Each example embodiment provided in the following description is not excluded from being associated with one or more features of another example or another example embodiment also provided herein or not provided herein but consistent with the present disclosure. It will be understood that when an element or layer is referred to as being "connected to" or "coupled to" another element, it can be directly connected or coupled to the other element, or intervening elements may be present. By contrast, when an element is referred to as being "directly connected to" or "directly coupled to" another element, there are no intervening elements present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be also understood that, even if a certain step or operation of manufacturing an apparatus or structure is described later than another step or operation, the step or operation may be performed later than the other step or operation unless the other step or operation is described as being performed after the step or operation.

Figure 1:
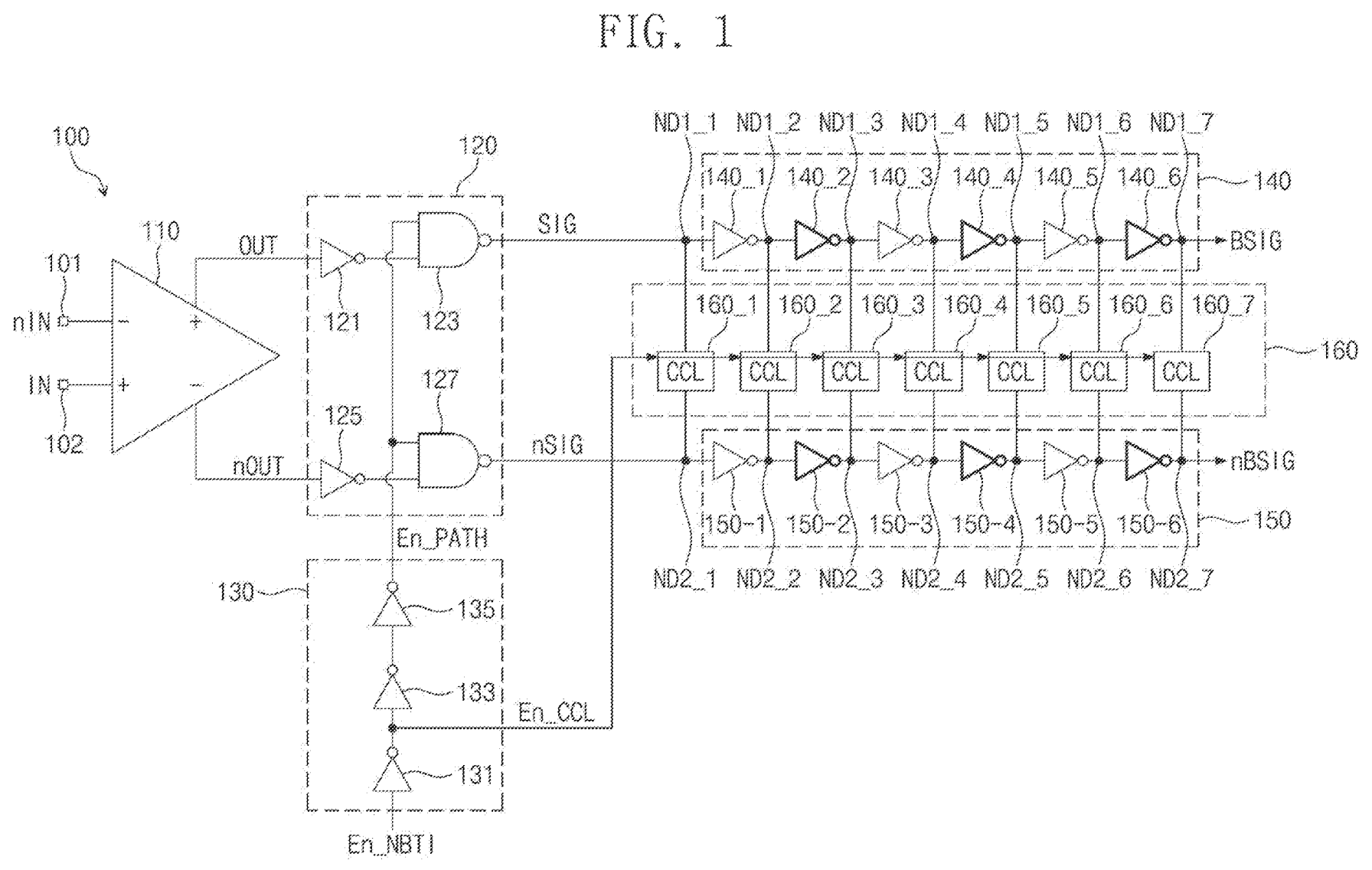

FIG. 1 is a circuit diagram of a differential signaling circuit, according to an example embodiment.

Referring to FIG. 1, a differential signaling circuit 100 includes a differential amplifier 110, a phase control circuit 120 (also referred to as a gating circuit), a control signal generating circuit 130, a first signal path circuit 140, a second signal path circuit 150, and a duty ratio (duty rate) correction (or calibration) circuit 160. The differential signaling circuit 100 may be used for a high-frequency input/output interface in a differential signaling system. The differential signaling circuit 100 may be integrated into an integrated circuit.

Differential signaling is a method of electrically transmitting information using two complementary signals. A differential signal pair is transmitted through a pair of conductors, which may be wires, such as, for example a twisted-pair, a ribbon cable, or traces on a printed circuit board (PCB).

The differential amplifier 110 amplifies differential input signals nIN and IN received through pads (also referred to as pins) 101 and 102 to generate differential output signals OUT and nOUT. According to example embodiments, the differential amplifier 110 may be replaced with an amplifier that converts a single-ended input signal into differential the output signals OUT and nOUT.

In FIG. 1, one (nIN) of the differential input signals nIN and IN is input to an inverting input terminal (−) and the other one (IN) is input to a non-inverting input terminal (+), and one (OUT) of the differential output signals OUT and nOUT is output through a first output terminal (+) and the other one nOUT is output through a second output terminal (−). However, this is only illustrative.

Figure 3:
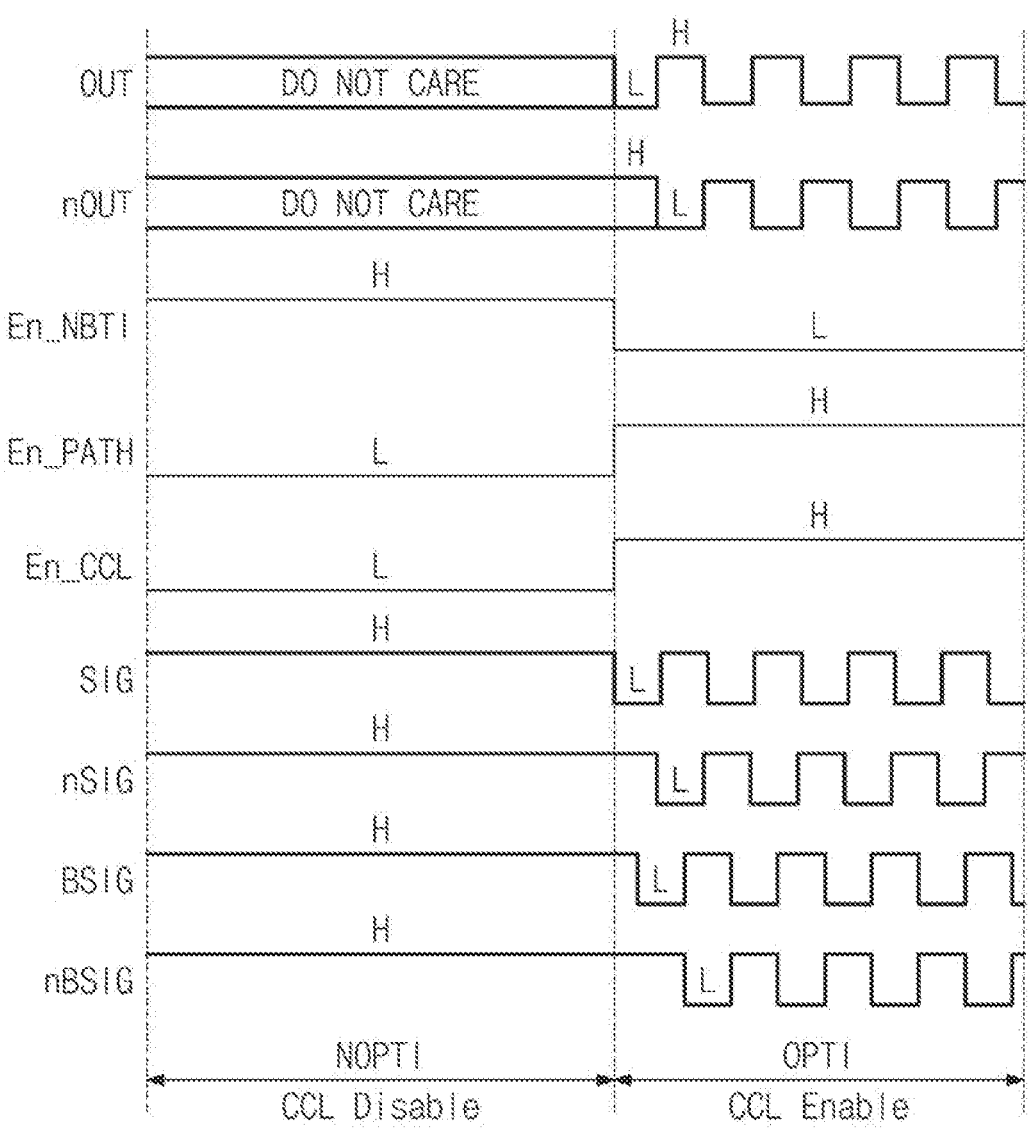
FIG. 3 is a timing diagram for describing an operation of a differential signaling circuit illustrated in FIG. 1, according to an example embodiment.

The phase control circuit 120 receives the differential output signals OUT and nOUT from the differential amplifier 110, outputs DC signals SIG and nSIG each having the same level (e.g., a high level 'H') as each other in a first operating period (NOPTI in FIG. 3), and transmits the differential output signals OUT and nOUT to the first signal path circuit 140 and the second signal path circuit 150, respectively, in a second operating period (OPTI in FIG. 3).

The phase control circuit 120 can function as a driver, and includes a first gating circuit and a second gating circuit. The first gating circuit includes a first inverter 121 and a first NAND gate 123. The second gating circuit includes a second inverter 125 and a second NAND gate 127.

FIG. 3 is a timing diagram for describing an operation of a differential signaling circuit illustrated in FIG. 1.

Referring to FIGS. 1 and 3, the first gating circuit transmits the first DC signal SIG of the DC signals SIG and nSIG to the first signal path circuit 140 in response to a gating control signal En_PATH having a first level (e.g., a low level 'L') during the first operating period NOPTI.

However, the first gating circuit transmits a first signal (OUT=SIG) of differential output signals (OUT=SIG and nOUT=nSIG) to the first signal path circuit 140 in response to the gating control signal En_PATH having a second level (e.g., a high level 'H') during the second operating period OPTI.

The second gating circuit transmits the second DC signal nSIG of the DC signals SIG and nSIG to the first signal path circuit 140 in response to the gating control signal En_PATH having the first level 'L' during the first operating period NOPTI.

However, the second gating circuit transmits a second signal (nOUT=nSIG) of the differential output signals (OUT=SIG and nOUT=nSIG) to the second signal path circuit 150 in response to the gating control signal En_PATH having the second level 'H' during the second operating period OPTI.

The control signal generating circuit 130 of FIG. 1 generates a duty ratio correction enable signal En_CCL and the gating control signal En_PATH in response to an enable control signal En_NBTI.

The control signal generating circuit 130 includes an inverter 131 receiving the enable control signal En_NBTI and a buffer generating the gating control signal En_PATH by buffering an output signal En_CCL of the inverter 131. The buffer includes two inverters 133 and 135 connected in series with each other.

Referring back to FIG. 1, the first signal path circuit 140 includes a first group of inverters 140_1 to 140_6 connected in series with one another, and the second signal path circuit 150 includes a second group inverters 150_1 to 150_6 connected in series with one another.

In FIG. 1, for convenience of description, six inverters 140_1 to 140_6 and 150_1 to 150_6 are illustrated, but this is illustrative and example embodiments are not limited thereto.

First inverters among the first group of inverters 140_1 to 140_6 illustrated as an example in FIG. 1 and second inverters respectively paired with the first inverters among the second group of inverters 150_1 to 150_6 may be degraded by negative bias temperature instability (NBTI).

NBTI is a type of key reliability issue in MOSFETs, and for example, may increase due to aging of the MOSFET. The NBTI appears as an increase in a threshold voltage of the MOSFET, a decrease in drain current of the MOSFET and a decrease in transconductance of the MOSFET. The NBTI appears primarily in p-channel MOSFETs operating with a negative gate-source voltage.

When each of the DC signals SIG and nSIG is designed to output a high level 'H' in the first operating period NOPTI, the first inverters refer to even-numbered inverters 140_2, 140_4, and 140_6 among the first group of inverters 140_1 to 140_6, and the second inverters respectively paired with the first inverters refer to even-numbered inverters 150_2, 150_4, and 150_6 among the second group of inverters 150_1 to 150_6.

However, when each of the DC signals SIG and nSIG is designed to output a low level 'L' in the first operating period NOPTI according to example embodiments, the first inverters refer to odd-numbered inverters 140_1, 140_3, and 140_5 among the first group of inverters 140_1 to 140_6, and the second inverters respectively paired with the first inverters refer to odd-numbered inverters 150_1, 150_3, and 150_5 among the second group of inverters 150_1 to 150_6.

The duty ratio correction circuit 160 is connected between the first signal path circuit 140 and the second signal path circuit 150, is disabled in the first operating period NOPTI, and is enabled in the second operating period OPTI to correct (i.e., 'adjust', 'compensate', or 'recover') duty ratios of the differential output signals (OUT=SIG and nOUT=nSIG) transmitted by the control signal generating circuit 130 to be equal to each other. The transmitted signals SIG and nSIG are the differential signals.

The duty ratio correction circuit 160 includes one or more cross-coupled inverter latches 160_1 to 160_7 (also referred to as cross-coupled inverters).

The first cross-coupled inverter latch 160_1 is connected between input terminals ND1_1 and ND2_1 of the first inverter pair 140_1 and 150_1, the second cross-coupled inverter latch 160_2 is connected between output terminals ND1_2 and ND2_2 of the first inverter pair 140_1 and 150_1, and the seventh cross-coupled inverter latch 160_7 is connected between output terminals ND1_7 and ND2_7 of the sixth inverter pair 140_6 and 150_6. Each of the cross-coupled inverter latches 160_3 to 160_6 is connected between input terminals (or output terminals) of the corresponding inverter.

FIG. 2 is a circuit diagram of a cross-coupled inverter latch illustrated in FIG. 1.

Because structures of the cross-coupled inverter latches 160_1 to 160_7 are the same as each other, the structure of the first cross-coupled inverter latch 160_1 connected between the input terminals ND1_1 and ND2_1 of the first inverter pair 140_1 and 150_1 is representatively illustrated and described in FIG. 2.

The first cross-coupled inverter latch 160_1 includes two inverters INV1 and INV2, and each of the two inverters INV1 and INV2 is enabled or disabled depending on a level of the duty ratio correction enable signal En_CCL. An input terminal of inverter INV1 is connected to an output terminal of inverter INV2, and an output terminal of inverter INV1 is connected to an input terminal of inverter INV2.

Figure 7:
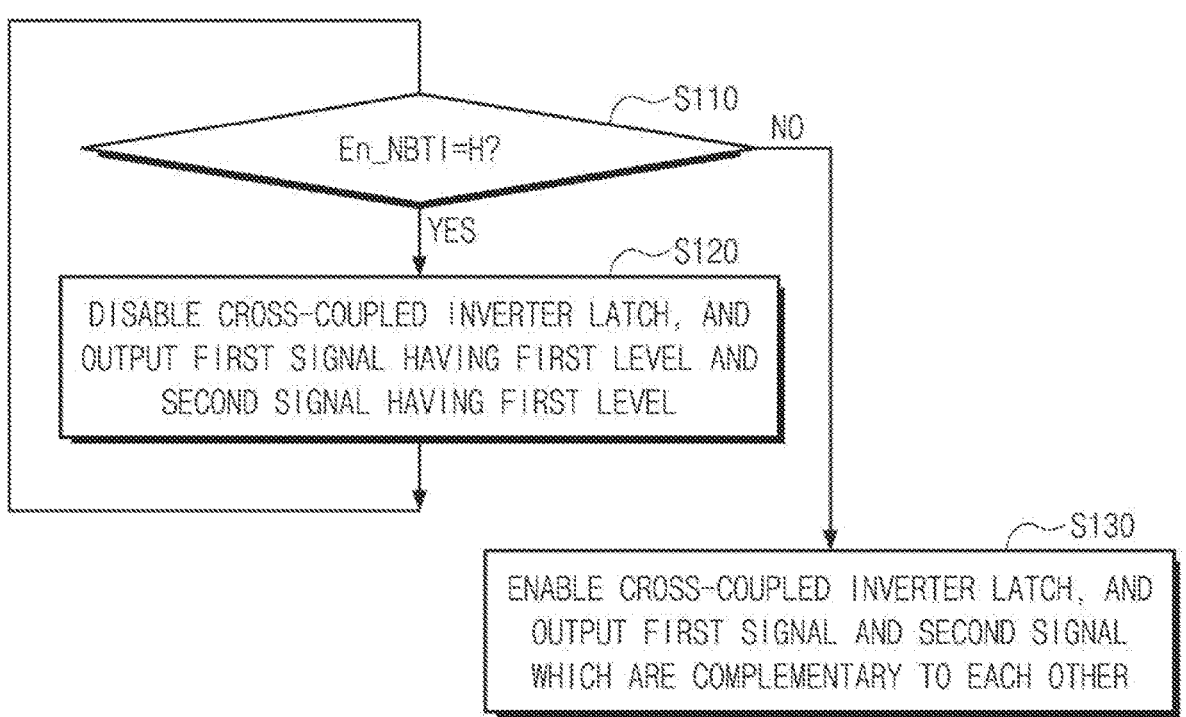
FIG. 7 is a flow chart illustrating an operation of a differential signaling circuit illustrated in FIG. 1, according to an example embodiment.

FIG. 7 is a flow chart illustrating an operation of a differential signaling circuit illustrated in FIG. 1.

The operation of the differential signaling circuit 100 in the first operating period NOPTI will be described with reference to FIGS. 1 to 3 and 7. The first operating period NOPTI may be longer than the second operating period OPTI.

When the enable control signal En_NBTI is at a high level 'H' (YES in S110), the control signal generating circuit 130 generates a duty ratio correction enable signal En_CCL having a low level 'L' by using the third inverter 131 and outputs it to the duty ratio correction circuit 160, and generates a gating control signal En_PATH having a low level 'L' by using the fourth inverter 133 and the fifth inverter 135 connected in series with each other and outputs it to the phase control circuit 120.

Each of the cross-coupled inverter latches 160_1 to 160_7, and CCL included in the duty ratio correction circuit 160 is disabled in response to the duty ratio correction enable signal En_CCL having a low level 'L' (S120). Therefore, each of the cross-coupled inverter latches 160_1 to 160_7 does not perform a duty ratio correction operation.

Regardless of a level of each of the differential output signals OUT and nOUT output from the differential amplifier 110, the phase control circuit 120 outputs the first signal SIG having a first level (or a high level 'H') to the first signal path circuit 140, and simultaneously (or in parallel) outputs the second signal nSIG having the first level (or a high level 'H') to the second signal path circuit 150 (S120). In this case, a state of the first signal SIG and a state of the second signal nSIG are the same.

A first output signal BSIG having a high level 'H' is output by the first signal path circuit 140, for example, the first group of inverters 140_1 to 140_6 connected in series with one another. In addition, a second output signal nBSIG having a high level 'H' is output by the second signal path circuit 150, for example, the second group of inverters 150_1 to 1506 connected in series with one another.

The operation of the differential signaling circuit 100 in the second operating period OPTI will be described with reference to FIGS. 1 to 3 and 7.

When the enable control signal En_NBTI is at a low level 'L' (NO in S110), the control signal generating circuit 130 generates the duty ratio correction enable signal En_CCL having a high level 'H' and outputs it to the duty ratio correction circuit 160, and generates the gating control signal En_PATH having a high level 'H' and outputs it to the phase control circuit 120.

Each of the cross-coupled inverter latches 160_1 to 160_7 included in the duty ratio correction circuit 160 is enabled in response to the duty ratio correction enable signal En_CCL having a high level 'L' (S130). Therefore, each of the cross-coupled inverter latches 160_1 to 160_7 may perform the duty ratio correction operation.

When one (e.g., OUT) of the differential output signals OUT and nOUT is a low level 'L' and the other (e.g., nOUT) of the differential output signals OUT and nOUT is a high level 'H', in response to the gating control signal En_PATH having a high level 'H', the phase control circuit 120 outputs the first signal SIG having a second level (or a low level 'L') and the second signal nSIG having a first level (or a high level 'H') (S130). In this case, the first signal SIG and the second signal nSIG are differential (or complementary) signals.

That is, according to the gating control signal En_PATH having a high level 'H', the phase control circuit 120 transmits the differential output signals (OUT=SIG and nOUT=nSIG) to the first signal path circuit 140 and the second signal path circuit 150, respectively.

The first output signal BSIG having a low level 'L' is output by the first group of inverters 140_1 to 140_6 connected in series with one another, and the second output signal nBSIG having a high level 'H' is output by the second group of inverters 150_1 to 150_6 connected in series with one another. In this case, the output signals BSIG and nBSIG are differential signals.

When one (e.g., OUT) of the differential output signals OUT and nOUT is a high level 'H' and the other (e.g., nOUT) of the differential output signals OUT and nOUT is a low level 'L', in response to the gating control signal En_PATH having a high level 'H', the phase control circuit 120 outputs the first signal SIG having a first level (or a high level 'H') and the second signal nSIG having a second level (or a low level 'L') (S130). In this case, the first signal SIG and the second signal nSIG are differential (or complementary) signals.

That is, according to the gating control signal En_PATH having a high level 'H', the phase control circuit 120 transmits the differential output signals (OUT=SIG and nOUT=nSIG) to the first signal path circuit 140 and the second signal path circuit 150, respectively.

The first output signal BSIG having a high level 'H' is output by the first group of inverters 140_1 to 140_6 connected in series with one another, and the second output signal nBSIG having a low level 'L' is output by the second group of inverters 150_1 to 150_6 connected in series with one another. In this case, the output signals BSIG and nBSIG are differential signals.

Figure 4:
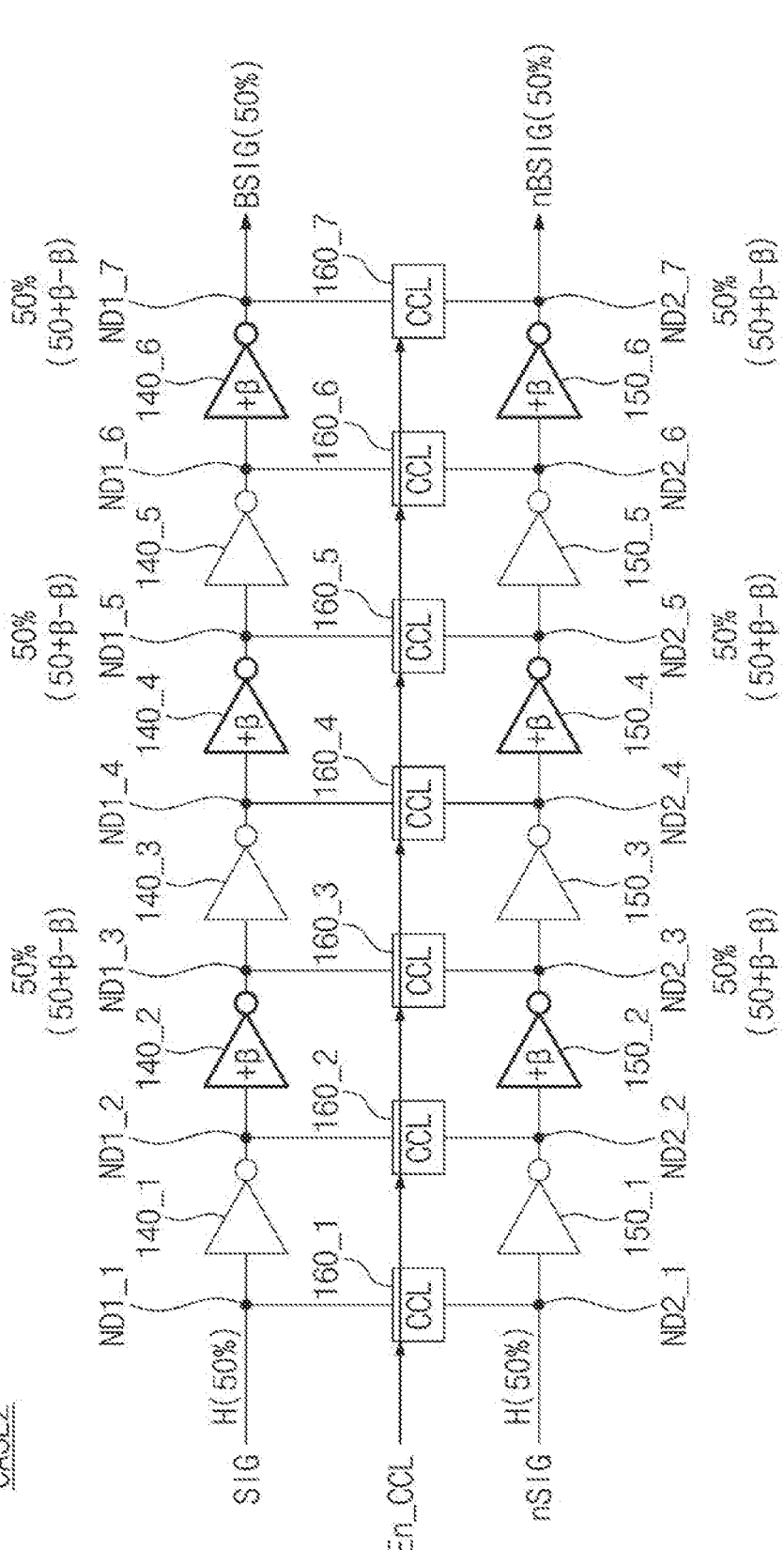
FIG. 4 is a conceptual diagram for describing a case in which a duty ratio is corrected using a differential signaling circuit illustrated in FIG. 1 in a second operating period when phases of signals output from the phase control circuit are the same in a first operating period, according to an example embodiment.

FIG. 4 is a conceptual diagram for describing a case in which a duty ratio is corrected using a differential signaling circuit illustrated in FIG. 1 in a second operating period when phases of signals output from the phase control circuit are the same in a first operating period.

Referring to FIGS. 1 and 3, in the first operating period NOPTI, the phase control circuit 120 outputs the first signal SIG having a high level 'H' and the second signal nSIG having a high level 'H' according to the gating control signal En_PATH having a low level 'L'.

As in the example illustrated in FIGS. 1 and 4, as the first signal SIG having a high level 'H' is output, each of the even-numbered inverters 140_2, 140_4, and 140_6 among the first group of inverters 140_1 to 140_6 connected in series with one another receives a signal having a low level 'L' and is affected due to the NBTI degradation, and as the second signal nSIG having a high level 'H' is output, each of the even-numbered inverters 150_2, 150_4, and 150_6 among the second group of inverters 150_1 to 150_6 connected in series with one another receives a signal having a low level 'L' and is affected due to the NBTI degradation.

In the second operating period OPTI, the phase control circuit 120 transmits (or passes) the differential output signals (OUT=SIG and nOUT=nSIG) to the first signal path circuit 140 and the second signal path circuit 150, respectively, depending on the gating control signal En_PATH having a high level 'H'.

The NBTI degradation directions of the differential signals SIG and nSIG are the same. For example, the duty ratio distortion directions of each of the differential signals SIG and nSIG are the same. For example, at the outputs of the even-numbered inverts 140_2, 140_4, and 140_6 of the first signal path circuit 140, duty ratios of the differential signals SIG and nSIG are distorted in an increasing direction. That is, if there is no duty ration correction, the portion of high level 'H' in the first signal SIG period may be increased at the outputs of the even-numbered inverts 140_2, 140_4, and 140_6 of the first signal path circuit 140. Also, duty ratios of the differential signals SIG and nSIG are distorted in the increasing direction. That is, if there is no duty ration correction, the portion of high level 'H' in the second signal nSIG period may be increased at the outputs of the even-numbered inverts 150_2, 150_4, and 150_6 of the second signal path circuit 150.

When the duty ratios of the differential signals SIG and nSIG respectively transmitted through the first signal path circuit 140 and the second signal path circuit 150 are the same, each of the cross-coupled inverter latches 160_1 to 160_7 may correct the duty ratio.

For example, each of the cross-coupled inverter latches 160_1 to 160_7 interpolates the first duty ratio of a signal (e.g., SIG) transmitted through the first signal path circuit 140 and the second duty ratio of a signal (e.g., nSIG) transmitted through the second signal path circuit 150 to correct (or adjust) the first duty ratio and the first duty ratio to be equal to each other.

As illustrated in FIG. 4, it is assumed that the duty ratio of each of the signal SIG and nSIG is 50%, and a change (or amount of change) in the duty ratio of each of the even-numbered inverters 140_2, 140_4, 140_6, 150_2, 150_4, and 150_6 affected by the NBTI degradation is $\beta$. In this case, the change (or amount of change) of the duty ratio due to the PVT variation of each of the inverters 140_1 to 1406 and 150-1 to 1506 is not considered.

When the duty ratios of the output signals of the inverters 140_2 and 150_2 are the same as $(50+\beta)\%$, the cross-coupled inverter latch 160_3 may correct (or adjust) the duty ratios of the output signals of the inverters 140_2 and 150_2 by $-\beta$ from $(50+\beta)\%$. Accordingly, each of the duty ratios of the output signals of the inverters 140_2 and 150_2 is corrected from $(50+\beta)\%$ to 50%. In other words, the cross-coupled inverter latch 160_3 inverts the level of the first signal SIG, which is an output of the inverter 140_2, and outputs the inverted level of the first signal SIG to the node ND2_3. The cross-coupled inverter latch 160_3 inverts the level of the second signal nSIG, which is an output oft the inverter 150_2, and outputs the inverted level of the second signal nSIG to the node ND1_3. Through this, the cross-coupled inverter latch 160_3 may interpolate the first signal SIG and the second signal nSIG to correct the duty ratio. Assuming that there is no duty ratio correction by the cross-coupled inverter latch 160_3, the portion of the high level H in the first signal SIG period is $(50+\beta)\%$ and the portion of the low level L in the first signal SIG period is $(50-\beta)\%$ at the node ND1_3. Also, the portion of the high level H in the second signal nSIG period is $(50+\beta)\%$ and the portion of the low level L in the second signal nSIG period is $(50-\beta)\%$ at the node ND2_3. The cross-coupled inverter latch 160_3 inverts the level of the first signal SIG of the node ND1_3 and outputs the inverted level of the first signal SIG to the node ND2_3 for interpolation of duty ratio of the differential signals SIG ad nSIG. Also, the cross-coupled inverter latch 160_3 inverts the level of the second signal nSIG of the node ND2_3 and outputs the inverted level of the second signal nSIG to the node ND1_3. For example, the portion of high level H in the first signal SIG period $(50+\beta)\%$ related to output of inverter(140_2) and the portion of low level L in the second signal nSIG period $(50-\beta)\%$ are corrected to 50% by interpolation through cross-coupled inverter latch(160_3) at node ND1_3. Also, the portion of high level H in the second signal nSIG period $(50+\beta)\%$ related to output of inverter(150_2) and the portion of low level L in the first signal SIG period $(50-\beta)\%$ are corrected to 50% by interpolation through cross-coupled inverter latch(160_3) at node ND2_3.

The output signal of the inverter 140_2 corrected to 50% duty ratio is output through the inverters 140_3 and 140_4, and the output signal of the inverter 150_2 corrected to 50% duty ratio is output through the inverters 150_3 and 150_4 simultaneously or in parallel.

When the duty ratios of the output signals of the inverters 140_4 and 150_4 are the same as (50+β)%, the cross-coupled inverter latch 160_5 may correct (or adjust) the duty ratios of the output signals of the inverters 140_4 and 150_4 by 43 from (50+β)%. Accordingly, each of the duty ratios of the output signals of the inverters 140_4 and 150_4 is corrected from (50+β)% to 50%.

The output signal of the inverter 140_4 corrected to 50% duty ratio is output through the inverters 140_5 and 140_6, and the output signal of the inverter 150_4 corrected to 50% duty ratio is output through the inverters 150_5 and 150_6 simultaneously or in parallel.

When the duty ratios of the output signals of the inverters 140_6 and 150_6 are the same as (50+β)%, the cross-coupled inverter latch 160_7 may correct (or adjust) the duty ratios of the output signals of the inverters 140_6 and 150_6 by 43 from (50+β)%. Accordingly, each of the duty ratios of the output signals BSIG and nBSIG of the inverters 140_6 and 150_6 is corrected from (50+β)% to 50%.

As the number of cross-coupled inverter latch 160_7 increases, the ability to correct the duty ratio also increases.

Figure 5:
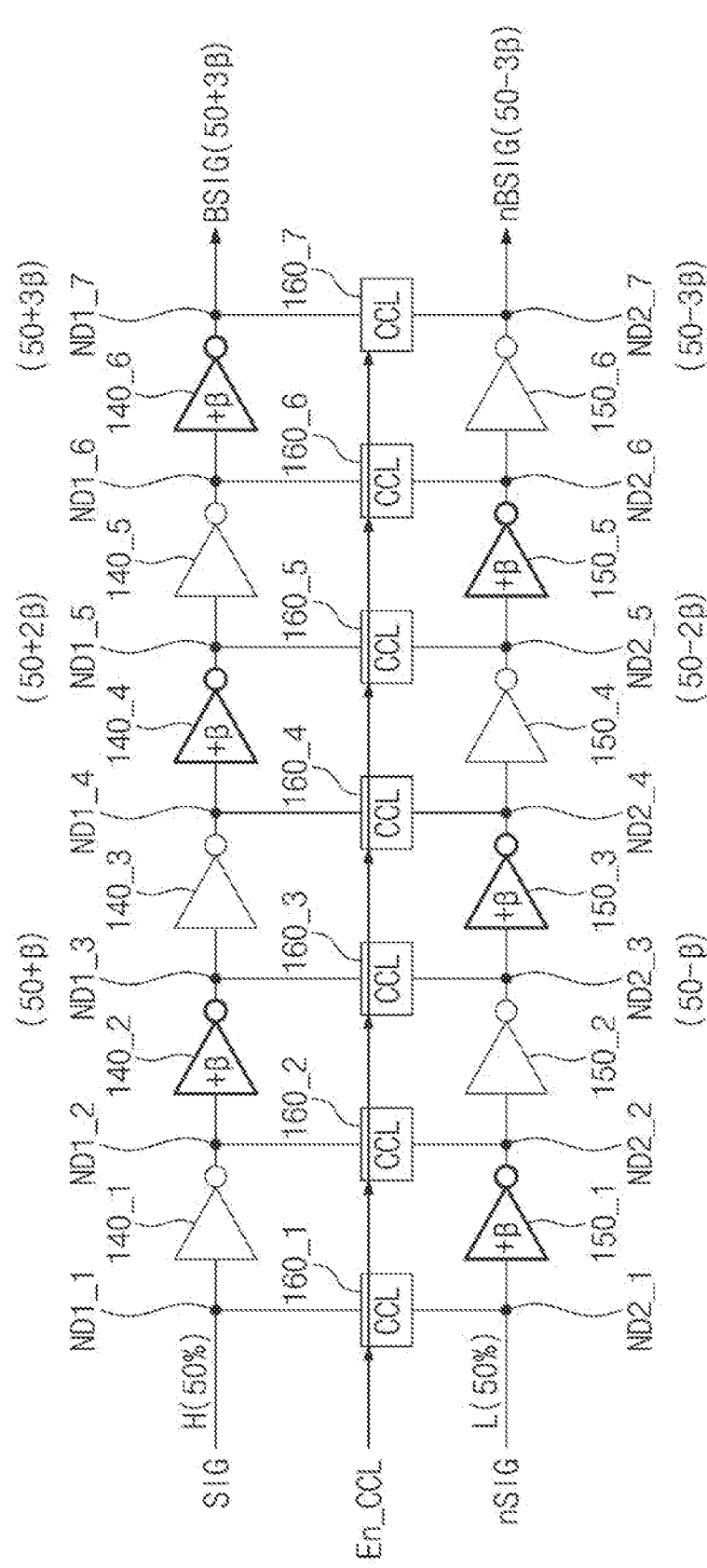
FIG. 5 is a conceptual diagram for describing a case in which a duty ratio is not corrected in a second operating period when phases of signals output from a phase control circuit are different from each other in a first operating period, according to an example embodiment.

FIG. 5 is a conceptual diagram for describing a case in which a duty ratio is not corrected in a second operating period when phases of signals output from a phase control circuit are different from each other in a first operating period.

Referring to FIG. 5 in the first operating period NOPTI, the first signal SIG having a high level 'H' is input to the first signal path circuit 140, and the second signal nSIG having a low level 'L' is input to the second signal path circuit 150.

As in the example illustrated in FIG. 5, as the first signal SIG having a high level 'H' is input, each of the even-numbered inverters 140_2, 140_4, and 140_6 among the first group of inverters 140_1 to 140_6 connected in series with one another receives a signal having a low level 'L' and is affected due to the NBTI degradation, and as the second signal nSIG having a low level 'L' is input, each of the odd-numbered inverters 150_1, 150_3, and 150_5 among the second group of inverters 150_1 to 150_6 connected in series with one another receives a signal having a low level 'L' and is affected due to the NBTI degradation.

In the second operating period OPTI, the differential output signals (OUT=SIG and nOUT=nSIG) is input to the first signal path circuit 140 and the second signal path circuit 150, respectively.

The directions of the NBTI degradation for each of the differential signals SIG and nSIG are opposite to each other. For example, the duty ratio distortion directions of each of the differential signals SIG and nSIG are opposite to each other. For example, at the outputs of the even-numbered inverts 140_2, 140_4, and 140_6 of the first signal path circuit 140, duty ratios of the first signal SIG is distorted in increasing direction, and the second signal nSIG is distorted in an decreasing direction. That is, if there is no duty ration correction, the portion of high level 'H' in the first signal SIG period may be increased at the outputs of the even-numbered inverts 140_2, 140_4, and 140_6 of the first signal path circuit 140. However, the portion of high level in the second signal nSIG period may be decreased at the output of the even-numbered inverts 150_2, 150_4, and 150_6 of the second signal path circuit 150. Because, the degradation of the odd-numbered inverts 150_1, 150_3, and 150_5 of the second signal path circuit 150 distorts the duty ratio in increasing direction and the even-numbered inverts 150_2, 150_4, and 150_6 of the second signal path circuit 150 invert the second signal nSIG.

When the duty ratios of the differential signals SIG and nSIG respectively transmitted through the first signal path circuit 140 and the second signal path circuit 150 are different from each other, each of the cross-coupled inverter latches 160_1 to 160_7 cannot correct the distorted duty ratio. When the duty ratios of the differential signals SIG and nSIG respectively transmitted through the first signal path circuit 140 and the second signal path circuit 150 are different from each other, each of the cross-coupled inverter latches 160_1 to 160_7 loses the ability to correct the duty ratio.

As illustrated in FIG. 5, it is assumed that the duty ratio of each of the signal SIG and nSIG is 50%, and a change (or amount of change) in the duty ratio of each of the inverters 140_2, 140_4, 140_6, 150_1, 150_3, and 150_5 affected by the NBTI degradation is β. In this case, the change (or amount of change) of the duty ratio due to the PVT variation of each of the inverters 140_1 to 1406 and 150_1 to 150_6 is not considered.

Because the duty ratio of the output signal of the inverter 140_2 is (50+β)% and the duty ratio of the output signal of the inverter 150_2 is (50−β)% (i.e., because the duty ratios of the output signals of inverters 140_2 and 150_2 are different from each other), the cross-coupled inverter latch 160_3 cannot respectively correct the duty ratios of the output signals of the inverters 140_2 and 150_2. In other words, the cross-coupled inverter latch 160_3 inverts the level of the first signal SIG, which is an output of the inverter 140_2, and outputs the inverted level of the first signal SIG to the node ND2_3. Also, The cross-coupled inverter latch 160_3 inverts the level of the second signal nSIG, which is an output oft the inverter 150_2, and outputs the inverted level of the second signal nSIG to the node ND1_3. Assuming that there is no duty ratio correction by the cross-coupled inverter latch 160_3, the portion of the high level H in the first signal SIG period is (50+β)% and the portion of the low level L in the first signal SIG period is (50−β)% at the node ND1_3. However, the portion of the high level H in the second signal nSIG period is (50−β)% and the portion of the low level L in the second signal nSIG period is (50+β)% at the node ND2_3. The cross-coupled inverter latch 160_3 inverts the level of the first signal SIG of the node ND1_3 and outputs the inverted level of the first signal SIG to the node ND2_3 for interpolation of duty ratio of the differential signals SIG ad nSIG. The cross-coupled inverter latch 160_3 inverts the level of the second signal nSIG of the node ND2_3 and outputs the inverted level of the second signal nSIG to the node ND1_3. However, the portion of high level H in the first signal SIG period (50+β)% related to output of inverter 140_2 and the portion of low level L in the second signal nSIG period (50+β)% related to output of inverter 150_2 cannot be corrected by interpolation through cross-coupled inverter latch 160_3 at the node ND1_3. Also, the portion of high level H in the second signal nSIG period (50−β)% related to output of inverter 150_2 and the portion of low level L in the first signal SIG period (50−β)% cannot be corrected by interpolation through cross-coupled inverter latch 1603 at the node ND2_3.

The output signal of the inverter 140_2 having a duty ratio of (50+β)% is outputted through the inverters 140_3 and 140_4, and the output signal of the inverter 150_2 having a duty ratio of (50−β)% is output through the inverters 150_3 and 150_4 simultaneously or in parallel.

Because the duty ratio of the output signal of the inverter 140_4 is (50+2β)% and the duty ratio of the output signal of the inverter 150_4 is (50−2β%, the cross-coupled inverter latch 160_5 may not correct the duty ratios of the output signals of the inverters 140_4 and 150_4.

The output signal of the inverter 140_4 having a duty ratio of (50+2β)% is outputted through the inverters 140_5 and 140_6, and the output signal of the inverter 150_4 having a duty ratio of (50−2β)% is output through the inverters 150_5 and 150_6 simultaneously or in parallel.

Because the duty ratio of the output signal of the inverter 140_6 is (50+3β)% and the duty ratio of the output signal of the inverter 150_6 is (50−3β)%, the cross-coupled inverter latch 160_5 may not correct the duty ratios of the output signals of the inverters 140_6 and 150_6.

Accordingly, the first signal path circuit 140 outputs the first output signal BSIG having a duty ratio of 50+3β, and the second signal path circuit 150 outputs the second output signal nBSIG having a duty ratio of 50−3β.

Figure 6:
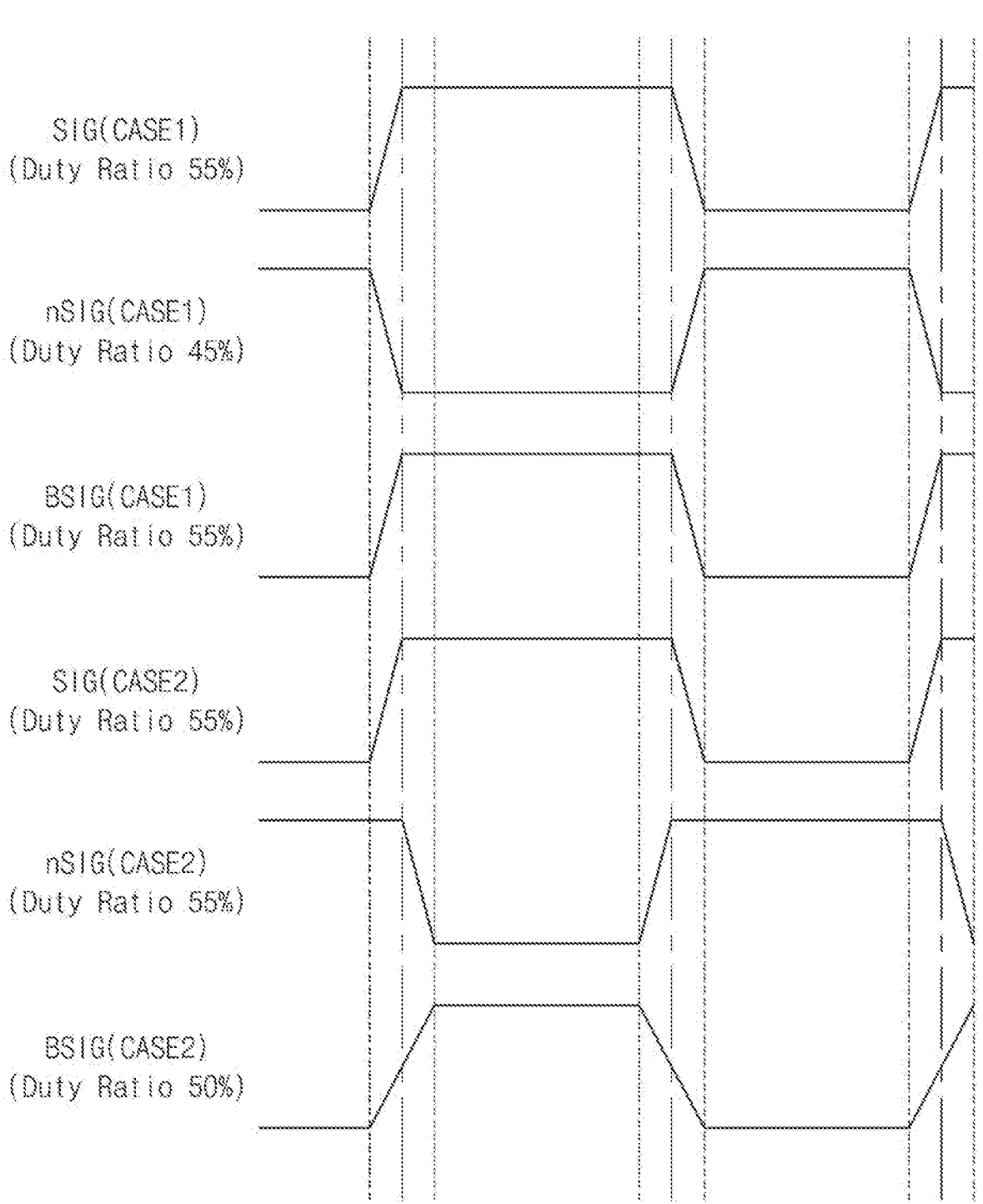
FIG. 6 is a timing diagram illustrating a method of controlling a duty ratio using a differential signaling circuit illustrated in FIG. 1, according to an example embodiment.

FIG. 6 is a timing diagram illustrating a method of controlling a duty ratio using a differential signaling circuit illustrated in FIG. 1.

Case 1 (CASE1) of FIG. 6 corresponds to case 1 (CASE1) illustrated in FIG. 5. For example, in the first operating period NOPTI, the first signal SIG has a high level 'H' and the second signal nSIG has a low level 'L'. Because of the degradation of NBTI occurred during the first operating period NOPTI, a duty ratio of the first signal SIG is 55% and a duty ratio of the second signal nSIG is 45% in the second operating period OPTI, and each of the cross-coupled inverter latches 160_1 to 160_7 may not correct the duty ratio of the first signal SIG transmitted through the first signal path circuit 140 and the duty ratio of the second signal nSIG transmitted through the second signal path circuit 150.

Therefore, the first signal path circuit 140 outputs the first output signal BSIG having a 55% duty ratio, and the second signal path circuit 150 outputs the second output signal nBSIG having a 55% duty ratio.

However, case 2 (CASE2) of FIG. 6 corresponds to case 2 (CASE2) illustrated in FIG. 4. For example, in the first operating period NOPTI, the first signal SIG has a high level 'H' and the second signal nSIG has a high level 'H'. Because of the degradation of NBTI occurred during the first operating period NOPTI, a duty ratio of each of the first signal SIG and the second signal nSIG is 55% in the second operating period OPTI, each of the cross-coupled inverter latches 160_1 to 160_7 corrects the duty ratio of the first signal SIG transmitted through the first signal path circuit 140 and the duty ratio of the second signal nSIG transmitted through the second signal path circuit 150 to be 50%, respectively.

Therefore, the first signal path circuit 140 outputs the first output signal BSIG having a 50% duty ratio, and the second signal path circuit 150 outputs the second output signal nBSIG having a 50% duty ratio.

Figure 8:
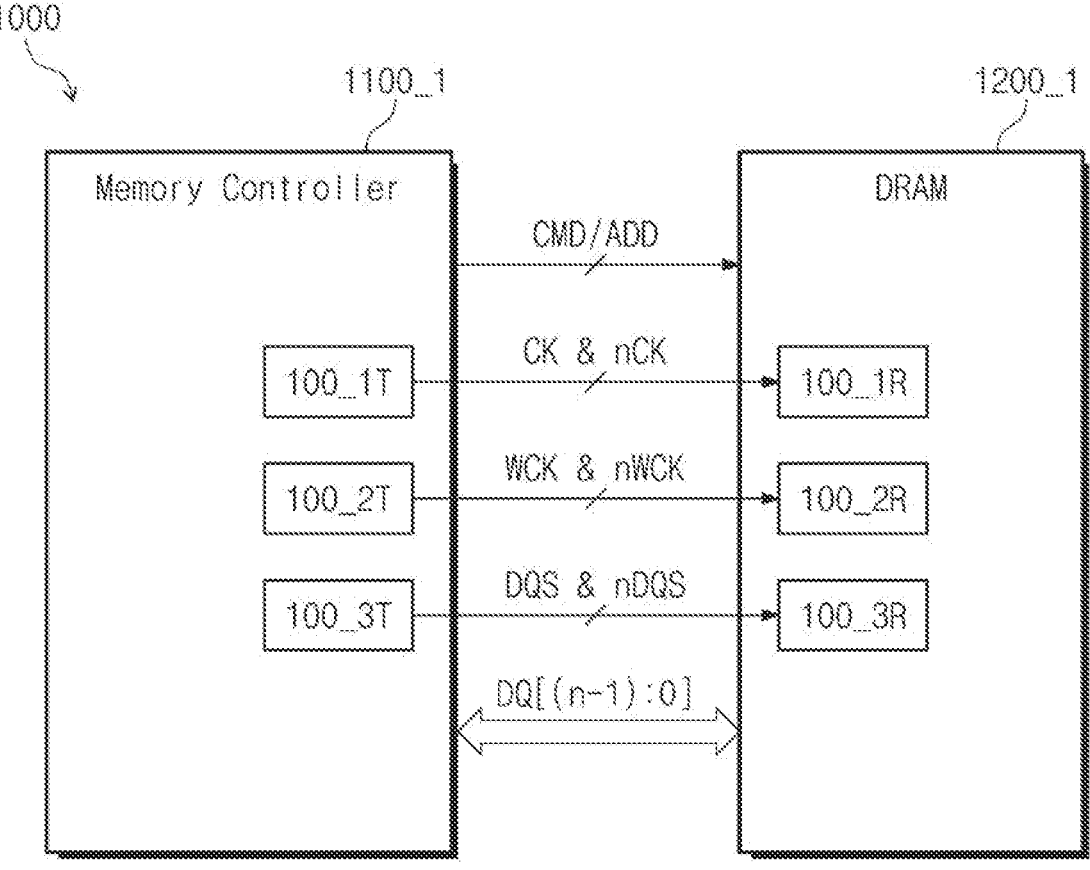
FIG. 8 is a block diagram of a memory system including a differential signaling circuit illustrated in FIG. 1, according to an example embodiment.

FIG. 8 is a block diagram of a memory system including a differential signaling circuit illustrated in FIG. 1. Referring to FIG. 8, a memory system (or semiconductor system) 1000 according to an example embodiment of a differential signaling system includes a memory controller 1100_1 and a memory device 1200_1. The memory device 1200_1 may be a dynamic random access memory (DRAM) or a synchronous DRAM (SDRAM).

The memory controller 1100_1 may transmit commands/addresses CMD/ADD, differential clock signals CK and nCK, differential write clock signals WCK and nWCK, differential data strobe signals DQS and nDQS, and n-bit data DQ[(n−1):0] to the memory device 1200_1, and may receive the n-bit data DQ[(n−1):0] from the memory device 1200_1. Here, 'n' is a natural number greater than or equal to 2.

The structure and operation of each of differential signaling circuits 100_1T, 100_1R, 100_2T, 100_2R, 100_3T, and 100_3R may be substantially similar to the differential signaling circuit 100 illustrated in FIG. 1.

Referring to FIGS. 1 to 4, 6, and 8, the first differential signaling circuit 100_1T outputs differential clock signals (CK=BSIG and nCK=nBSIG) to the memory device 1200_1, and the second differential signaling circuit 100_1R receives and processes differential clock signals (CK=IN and nCK=nIN) transmitted from the memory controller 1100_1.

The third differential signaling circuit 100_2T outputs differential write clock signals (WCK=BSIG and nWCK=nBSIG) to the memory device 1200_1, and the fourth differential signaling circuit 100_2R receives and processes differential write clock signals (WCK=IN and nWCK=nIN) transmitted from the memory controller 1100_1.

The fifth differential signaling circuit 100_3T outputs differential data strobe signals (DQS=BSIG and nDQS=nBSIG) to the memory device 1200_1, and the sixth differential signaling circuit 100_3R receives and processes differential data strobe signals (DQS=IN and nDQS=nIN) transmitted from the memory controller 1100_1.

Figure 9:
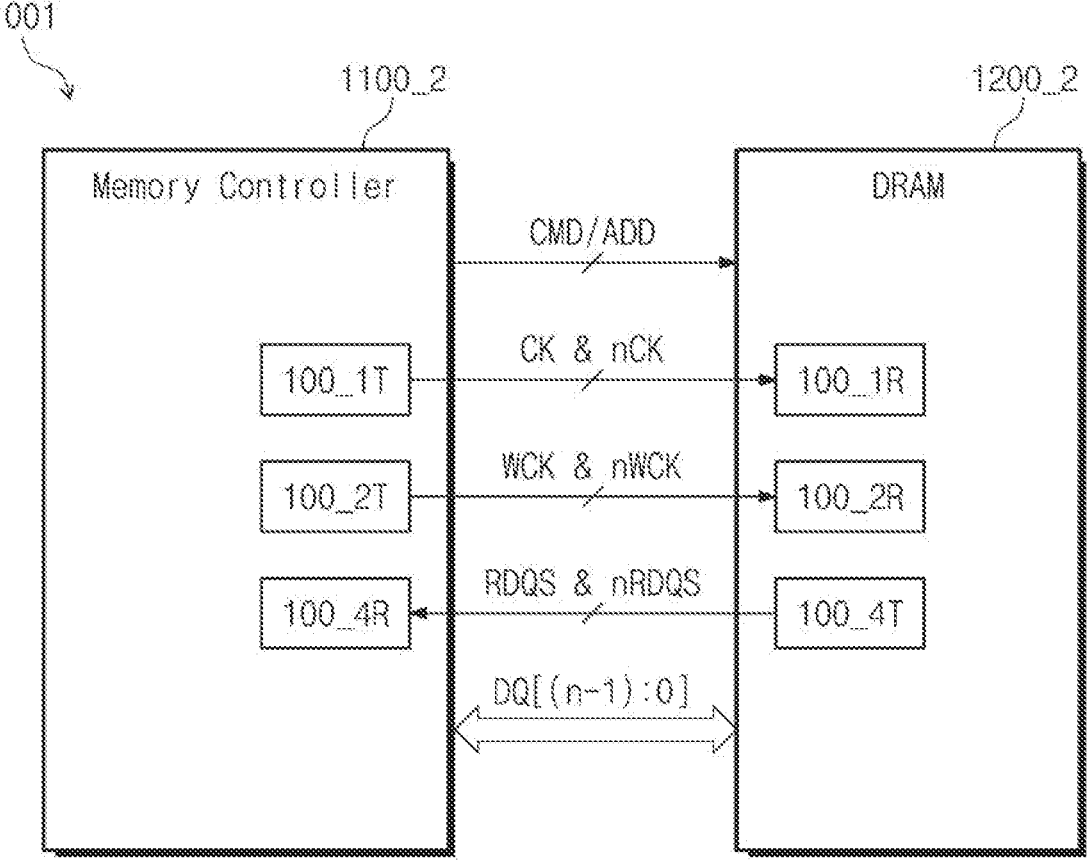
FIG. 9 is a block diagram of a memory system including a differential signaling circuit illustrated in FIG. 1, according to an example embodiment.

FIG. 9 is a block diagram of a memory system including a differential signaling circuit illustrated in FIG. 1. Referring to FIG. 9, a memory system (or semiconductor system) 1001 according to another example embodiment of a differential signaling system includes a memory controller 1100_2 and a memory device 1200_2. The memory device 1200_2 may be a low power double data rate (LPDDR) DRAM.

The memory controller 1100_2 may transmit commands/addresses CMD/ADD, differential clock signals CK and nCK, differential write clock signals WCK and nWCK, and n-bit data DQ[(n−1):0], and may receive read differential strobe signals RDQS and nRDQS and the n-bit data DQ[(n−1):0] from the memory device 1200_1.

Referring to FIGS. 1 to 4, 6, and 9, the structure and operation of differential signaling circuits 100_4T and 100_4R are the same as those of the differential signaling circuit 100 illustrated in FIG. 1.

The seventh differential signaling circuit 100_4T outputs read differential data strobe signals (RDQS=BSIG and nRDQS=nBSIG) to the memory controller 1100_2, and the eighth differential signaling circuit 100_4R receives and processes read differential data strobe signals (RDQS=IN and nRDQS=nIN) transmitted from the memory device 1200_2.

Figure 10:
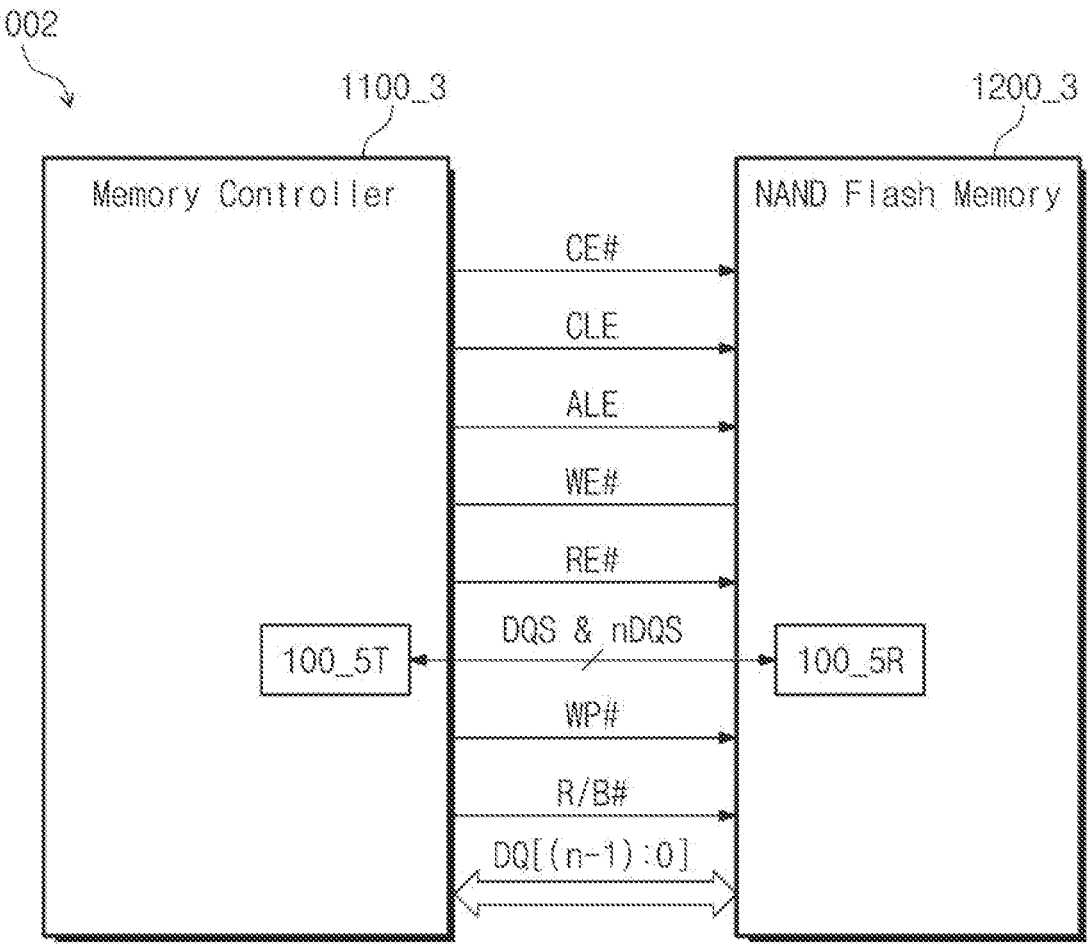
FIG. 10 is a block diagram of a memory system including a differential signaling circuit illustrated in FIG. 1, according to an example embodiment.

FIG. 10 is a block diagram of a memory system including a differential signaling circuit illustrated in FIG. 1. Referring to FIG. 10, a memory system (or a semiconductor system) 1002 according to another example embodiment of a differential signaling system includes a memory controller 1100_3 and a memory device 1200_3. The memory device 1200_3 may be a NAND flash memory device.

The memory controller 1100_3 may transmit a chip enable signal CE #, a command latch enable signal CLE, an address latch enable signal ALE, a write enable signal WE #, a read enable signal RE #, a write protect signal WP #, a ready/busy signal R/B #, differential data strobe signals DQS and nDQS, and n-bit data DQ[(n−1):0] to the memory device 1200_3, and may receive the differential data strobe signals DQS and nDQS and the n-bit data DQ[(n−1):0] from the memory device 1200_3.

FIGS. 1 to 4, 6, and 10, a ninth differential signaling circuit 100_5T transmits differential data strobe signals (DQS=SIG and nDQS=nSIG) to the memory device 1200_3, and a tenth differential signaling circuit 100_5R receives and processes the differential data strobe signals (RDQS=IN and nRDQS=nIN) transmitted from the memory controller 1100_3.

As another example, the tenth differential signaling circuit 100_5R transmits the differential data strobe signals (DQS=SIG and nDQS=nSIG) to the memory controller 1100_3, and the ninth differential signaling circuit 100_5T receives and processes the differential data strobe signals (DQS=IN and nDQS=nIN) transmitted from the memory device 1200_3.

The structure and operation of each of the differential signaling circuits 100_5T and 100_5R are the same as those of the differential signaling circuit 100 illustrated in FIG. 1.

Figure 11:
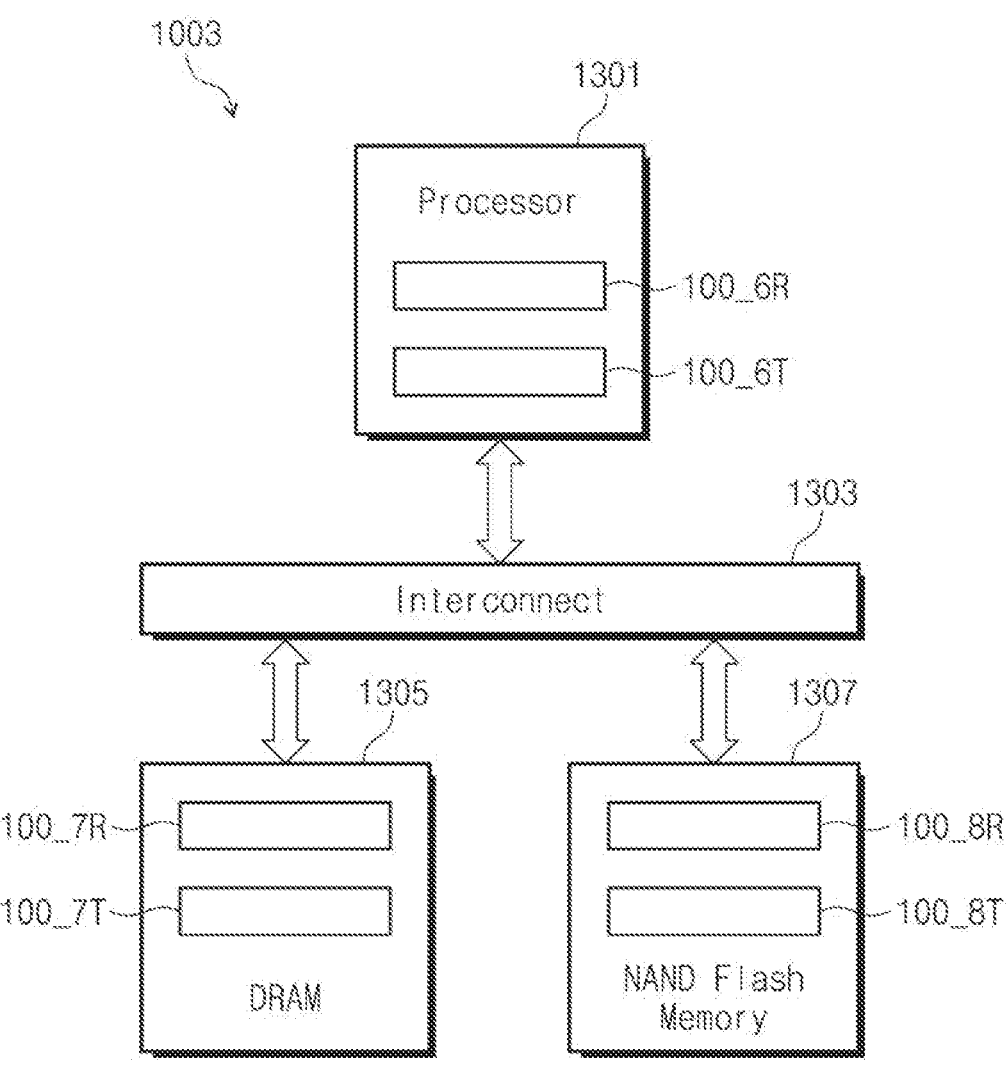
FIG. 11 is a block diagram of a differential signaling system including a differential signaling circuit illustrated in FIG. 1, according to an example embodiment.

FIG. 11 is a block diagram of a differential signaling system including a differential signaling circuit illustrated in FIG. 1. A differential signaling system (or semiconductor system) 1003 includes a processor 1301, an interconnect 1303 such as a bus (data bus or system bus), a DRAM 1305, and a NAND flash memory 1307.

The differential signaling system 1003 may be a PC or a mobile device, and the mobile device may be a smart phone, a tablet PC, a laptop computer, an Internet of Things (IoT) device, or a wearable computer.

The processor 1301 includes an eleventh differential signaling circuit 100_6T for transmitting differential signals generated therein to the DRAM 1305 or the NAND flash memory 1307 through the interconnect 1303, and a twelfth differential signaling circuit 100_6R for receiving and processing the differential signals transmitted from the DRAM 1305 or the NAND flash memory 1307 through the interconnect 1303.

The DRAM 1305 includes a thirteenth differential signaling circuit 100_7R for receiving and processing the differential signals transmitted from the processor 1301 through the interconnect 1303, and a fourteenth differential signaling circuit 100_7T for transmitting the differential signals generated therein to the processor 1301.

The NAND flash memory 1307 includes a fifteenth differential signaling circuit 100_8R for receiving and processing the differential signals transmitted from the processor 1301 through the interconnect 1303, and a sixteenth differential signaling circuit 100_8T for transmitting the differential signals generated therein to the processor 1301. The structure and operation of each of the differential signaling circuits 100_6T, 100_6R, 100_7T, 100_7R, 100_8T, and 100_8R are the same as those of the differential signaling circuit 100 illustrated in FIG. 1.

Figure 12:
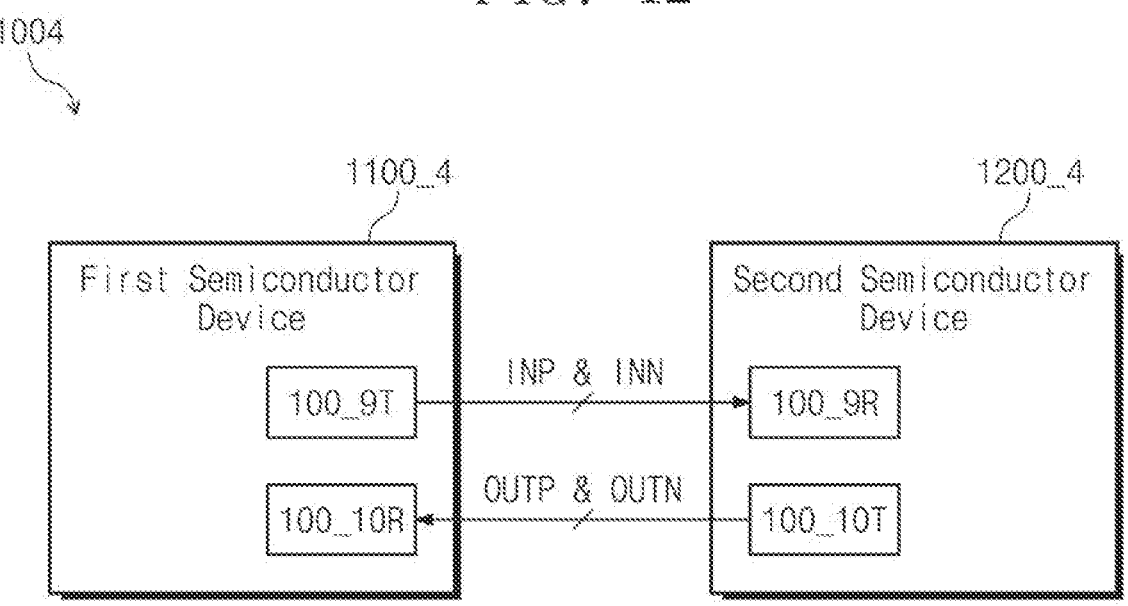
FIG. 12 is a block diagram of a differential signaling system including a differential signaling circuit illustrated in FIG. 1, according to an example embodiment.

FIG. 12 is a block diagram of a differential signaling system including a differential signaling circuit illustrated in FIG. 1. A differential signaling system (or semiconductor system) 1004 includes a first semiconductor device 1100_4 and a second semiconductor device 12004.

The first semiconductor device 1100_4 is any one of a System on Chip (SoC), a memory controller, a memory device, and a transmission/reception circuit, and the second semiconductor device 1200_4 is the other one of the SoC, the memory controller, and the memory device, and the transmission/reception circuit.

A seventeenth differential signaling circuit 100_9T of the first semiconductor device 1100_4 transmits differential signals (INP=BSIG and INN=nBSIG) to the second semiconductor device 1200_4, and an eighteenth differential signaling circuit 100_9R receives and processes differential signals (INP=IN and INN=nIN) transmitted from the first semiconductor device 1100_4.

A nineteenth differential signaling circuit 100_10T of the second semiconductor device 1200_4 transmits differential signals (BSIG=OUTP and nBSIG=OUTN) to the first semiconductor device 1100_4, and a twentieth differential signaling circuit 100_10R receives and processes differential signals (OUTP=IN and OUTN=nIN) transmitted from the second semiconductor device 12004.

The structure and operation of each of the differential signaling circuits 100_9T, 100_9R, 100_10T, and 100_10R are the same as those of the differential signaling circuit 100 illustrated in FIG. 1.

According to an example embodiment, a differential signaling circuit may recover a change in the duty ratio due to the NBTI by inducing duty ratio distortion due to NBTI deterioration caused by differential signals in the same direction, and then interpolating the differential signals.

Therefore, because the differential signaling circuit may compensate (adjust, remove, or recover) for the change in the duty ratio for each of the differential signals due to the NBTI degradation and generate differential signals each having a 50% duty ratio, signal integrity may be improved.

While aspects of example embodiments have been particularly shown and described, it will be understood that various changes in form and details may be made therein without departing from the spirit and scope of the following claims.

What is claimed is:

1. A differential signaling circuit comprising:
   a differential amplifier configured to generate differential signals;
   a first signal path circuit;
   a second signal path circuit;
   a phase control circuit configured to receive the differential signals having a common phase, output DC signals having a common level in a first operating period, and transmit the differential signals to the first signal path circuit and the second signal path circuit, respectively, in a second operating period; and
   a duty ratio correction circuit connected between the first signal path circuit and the second signal path circuit, and configured to control duty ratios of the differential signals to be equal to each other in the second operating period.

2. The differential signaling circuit of claim 1, wherein the first signal path circuit comprises a first plurality of inverters connected in series with each other,
   wherein the second signal path circuit comprises a second plurality of inverters connected in series with each other, and
   wherein first inverters among the first plurality of inverters and second inverters among the second plurality of inverters are degraded by Negative Bias Temperature Instability (NBTI).

3. The differential signaling circuit of claim 2, wherein, when each of the DC signals is at a first level, the first inverters are even-numbered inverters among the first plurality of inverters, and the second inverters are even-numbered inverters among the second plurality of inverters,
   wherein, when each of the DC signals is at a second level, the first inverters are odd-numbered inverters among the first plurality of inverters, and the second inverters are odd-numbered inverters among the second plurality of inverters, and wherein, the first level is greater than the second level.

4. The differential signaling circuit of claim 2, wherein the duty ratio correction circuit is connected between a terminal of one of the first inverters and a terminal of one of the second inverters.

5. The differential signaling circuit of claim 4, wherein the duty ratio correction circuit is a cross-coupled inverter latch.

6. The differential signaling circuit of claim 1, wherein the duty ratio correction circuit is further configured to interpolate each of the differential signals in the second operating period to control the duty ratios of the differential signals to be equal to each other.

7. The differential signaling circuit of claim 1, wherein the first operating period is longer than the second operating period.

8. The differential signaling circuit of claim 1, wherein the phase control circuit comprises:

a first gating circuit configured to, based on a gating control signal, transmit a first signal of the differential signals to the first signal path circuit or transmit a first DC signal of the DC signals to the first signal path circuit; and a second gating circuit configured to, based on the gating control signal, transmit a second signal of the differential signals to the second signal path circuit or transmit a second DC signal of the DC signals to the second signal path circuit.

9. The differential signaling circuit of claim 8, further comprising:

an inverter configured to invert an enable control signal; and a buffer configured to buffer an output signal of the inverter to generate the gating control signal.

10. The differential signaling circuit of claim 9, wherein the duty ratio correction circuit is disabled in the first operating period and enabled in the second operating period according to the output signal of the inverter, wherein the first operating period and the second operating period are defined according to whether the enable control signal is a high level or a low level.

11. A semiconductor system comprising:

a first semiconductor device; and a second semiconductor device comprising a differential signaling circuit, wherein the differential signaling circuit comprises:

a differential amplifier configured to generate differential signals;

a first signal path circuit;

a second signal path circuit;

a phase control circuit configured to receive the differential signals having a common phase, output DC signals having a common level in a first operating period, and to transmit the differential signals to the first signal path circuit and the second signal path circuit, respectively, in a second operating period; and a duty ratio correction circuit connected between the first signal path circuit and the second signal path circuit, and configured to control duty ratios of the differential signals to be equal to each other in the second operating period.

12. The semiconductor system of claim 11, wherein the first signal path circuit comprises a first plurality of inverters connected in series with each other, wherein the second signal path circuit comprises a second plurality of inverters connected in series with each other, and wherein first inverters among the first plurality of inverters and second inverters among the second plurality of inverters are degraded by Negative Bias Temperature Instability (NBTI).

13. The semiconductor system of claim 12, wherein, when each of the DC signals is at a first level, the first inverters are even-numbered inverters among the first plurality of inverters, and the second inverters are even-numbered inverters among the second plurality of inverters, wherein, when each of the DC signals is at a second level, the first inverters are odd-numbered inverters among the first plurality of inverters, and the second inverters are odd-numbered inverters among the second plurality of inverters, and wherein, the first level is greater than the second level.

14. The semiconductor system of claim 12, wherein the duty ratio correction circuit is connected between a terminal of one of the first inverters and a terminal of one of the second inverters.

15. The semiconductor system of claim 14, wherein the duty ratio correction circuit is a cross-coupled inverter latch, and wherein the cross-coupled inverter latch is configured to interpolate each of the differential signals in the second operating period to control the duty ratios of the differential signals to be equal to each other.

16. The semiconductor system of claim 11, the differential signaling circuit further comprises:

an inverter configured to invert an enable control signal; and a buffer configured to buffer an output signal of the inverter to generate a gating control signal, and wherein the phase control circuit comprises:

a first gating circuit configured to, based on the gating control signal, transmit a first signal of the differential signals to the first signal path circuit or transmit a first DC signal of the DC signals to the first signal path circuit; and a second gating circuit configured to, based on the gating control signal, transmit a second signal of the differential signals to the second signal path circuit or transmit a second DC signal of the DC signals to the second signal path circuit.

17. The semiconductor system of claim 16, wherein the duty ratio correction circuit is disabled in the first operating period and enabled in the second operating period depending on the output signal of the inverter, wherein the first operating period and the second operating period are defined according to whether the enable control signal is a high level or a low level.

18. The semiconductor system of claim 11, wherein a first one of the first semiconductor device and the second semiconductor device comprises a memory device, and wherein a second one of the first semiconductor device and the second semiconductor device comprises a memory controller.

19. A differential signaling method comprising:

receiving differential signals having a common phase;

generating DC signals, each having a common level in a first operating period;

transmitting the DC signals to a first signal path circuit and a second signal path circuit, respectively;

transmitting the differential signals to the first signal path circuit and the second signal path circuit, respectively, in a second operating period; and controlling duty ratios of the differential signals to be equal to each other in the second operating period.

20. The differential signaling method of claim 19, wherein the controlling of the duty ratios to be equal to each other comprises controlling a cross-coupled inverter latch connected between the first signal path circuit and the second signal path circuit, wherein the first signal path circuit comprises a first plurality of inverters connected in series with each other, wherein the second signal path circuit comprises a second plurality of inverters connected in series with each other, wherein first inverters among the first plurality of inverters and second inverters among the second plurality of inverters are degraded by Negative Bias Temperature Instability (NBTI), wherein the cross-coupled inverter latch is connected between a terminal of one of the first inverters and a terminal of one of the second inverters.

* * * * *